(12) United States Patent
Barou et al.

(10) Patent No.: US 6,175,275 B1
(45) Date of Patent: Jan. 16, 2001

(54) PREAMPLIFIER WITH AN ADJUSTABLE BANDWIDTH

(75) Inventors: Michel Barou, Voreppe; Danika Chaussy, Poisat, both of (FR)

(73) Assignee: STMicroelectronics S.A., Gentilly (FR)

( * ) Notice: Under 35 U.S.C. 154(b), the term of this patent shall be extended for 0 days.

(21) Appl. No.: 09/406,874

(22) Filed: Sep. 28, 1999

(51) Int. Cl.[7] .................................................. H03F 1/24
(52) U.S. Cl. ............................ 330/98; 330/99; 330/288
(58) Field of Search .................................. 330/278, 279, 330/280, 288, 98, 99, 100, 133, 134; 348/707

(56) References Cited

U.S. PATENT DOCUMENTS

| | | | |
|---|---|---|---|
| 3,127,565 | * | 3/1964 | Williams .............................. 328/127 |
| 3,252,105 | * | 5/1966 | Patchell ................................ 330/200 |
| 3,304,506 | * | 2/1967 | Weekes ................................ 328/151 |
| 3,392,345 | * | 7/1968 | Young .................................... 330/51 |
| 3,678,416 | * | 7/1972 | Burwen ................................. 333/17 |
| 5,007,038 | * | 4/1991 | Nakane et al. .................... 369/44.11 |

* cited by examiner

*Primary Examiner*—Robert Pascal
*Assistant Examiner*—Henry Choe
(74) *Attorney, Agent, or Firm*—Wolf, Greenfield & Sacks, P.C.; James H. Morris; Theodore E. Galanthay

(57) ABSTRACT

A preamplifier includes an output stage having a bandwidth which is adjustable by a control signal. The output stage includes an amplifier with an adjustable bandwidth. The amplifier includes a main input for receiving an input current, a main output for providing an output voltage, a resistor connected between the main input and output. A current amplifier with an adjustable gain is connected for receiving the input current. A capacitor is connected between an output of the current amplifier and the main output. An inverting transconductance circuit is connected between the output of the current amplifier and the main output.

6 Claims, 3 Drawing Sheets

PREAMPLIFIER WITH AN ADJUSTABLE BANDWIDTH

FIELD OF THE INVENTION

The present invention relates to an amplifier with an adjustable bandwidth suitable for preamplifying a video signal in CRT displays.

DISCUSSION OF THE RELATED ART

Video preamplifiers are used to process RGB video signals and to provide them to a power video amplifier that directly drives the cathodes of the tube. The processing applied to the video signals is mainly the amplification of the signal to adjust the picture contrast, the DC level adjustment in order to control the picture brightness, and the insertion of on-screen display signals in the video signal.

FIG. 1 represents a conventional video preamplifier. It comprises a transconductance circuit 2 connected to receive an input voltage VIN, followed by an adjustable gain stage 4 and a DC level stage 6, controlled by an external circuit such as a microprocessor 8. An NPN output transistor 10 is connected between a power supply terminal, and a reference terminal such as ground through a current source 12. The base of the transistor 10 is connected to an output terminal of circuit 6, and a resistor 14 connects the base of transistor 10 to ground. The output 16 of the preamplifier is taken at the emitter of transistor 10.

Transistor 10 acts as a voltage follower with a short rise time. The rise and fall times of transistor 10 determine the bandwidth of the preamplifier.

It is important to note that the connections between a preamplifier and the power amplifier that follows comprise parasitic inductances. Parasitic inductances usually give birth to important voltage overshoots when receiving signals that feature short rise and fall times. Therefore, special care must be taken for connecting a preamplifier with short rise and fall times to a power amplifier, in order to reduce these parasitic inductances.

For cost reduction reasons, preamplifier manufacturers tend to produce only a single type of preamplifier that features a large bandwidth, suited for high quality displays. Lower quality displays may use these preamplifiers, but it becomes necessary in these displays to improve the connections between the preamplifier and amplifier in order to reduce the parasitic inductance, which increase the design cost.

An object of the invention is to provide a single type of preamplifier which will provide satisfactory results both in high and low quality displays.

SUMMARY OF THE INVENTION

To achieve this object, the invention provides a preamplifier that comprises an output stage having a bandwidth which is adjustable by a control signal.

More specifically, the output stage comprises an amplifier with an adjustable bandwidth. The amplifier comprises a main input for receiving an input current, a main output for providing an output voltage, a resistor connected between the main input and output. A current amplifier with an adjustable gain is connected for receiving the input current. A capacitor is connected between an output of the current amplifier and the main output. An inverting transconductance circuit is connected between the output of the current amplifier and the main output.

The foregoing and other objects, features, aspects and advantages of the present invention will be discussed in detail in the following description of specific embodiments, taken in conjunction with the accompanying drawings, but not limited by them.

DESCRIPTION OF PREFERRED EMBODIMENTS

Figure 1:
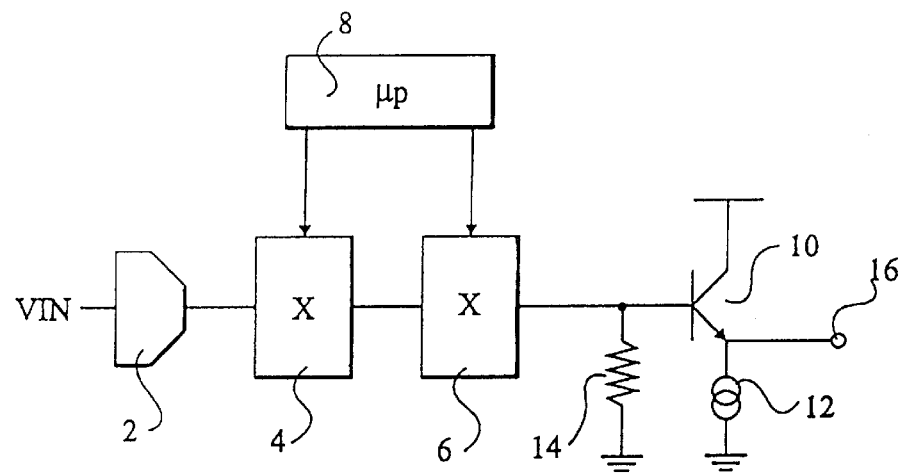
FIG. 1, previously described, schematically shows a conventional preamplifier.
Figure 2:
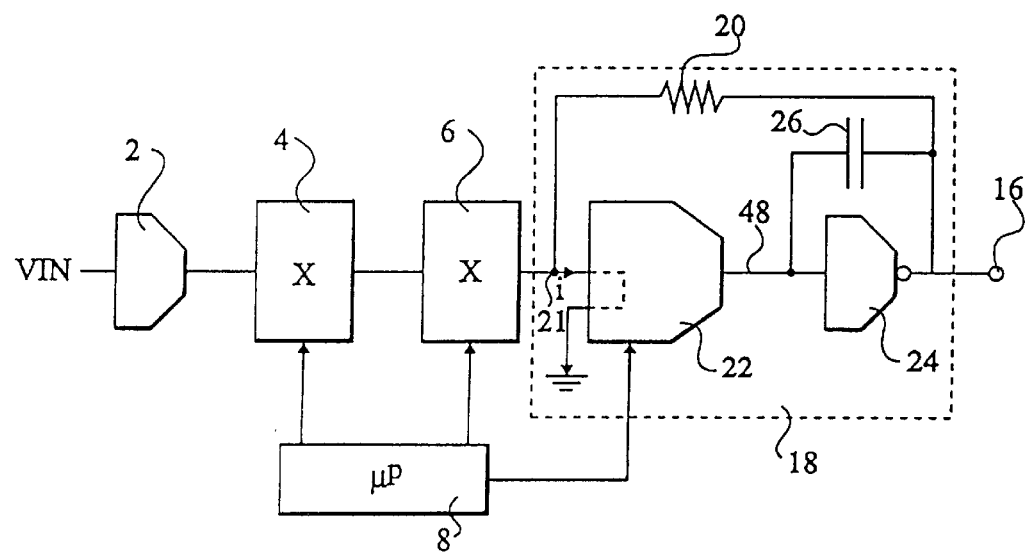
FIG. 2 schematically shows an embodiment of a preamplifier according to the invention.

As shown in FIG. 2, a video preamplifier according to the invention includes, as in the prior art, a transconductance circuit 2 followed by two processing blocks 4 and 6 that receive control signals from a microprocessor 8. Block 6 is followed by a specific output stage 18 which is designed according to the invention to have an adjustable bandwidth, controllable by microprocessor 8, for example. The output stage 18 comprises a resistor 20 connected between its input and output terminals 21 and 16. It further comprises a current amplifier 22 having an adjustable gain followed by an inverting transconductance circuit 24. A capacitor 26 is connected between the input and output terminals of the transconductance circuit 24.

With this arrangement, it appears that the unity-gain bandwidth of the stage is proportional to the gain G of current amplifier 22. More specifically, the unity-gain bandwidth is $f_c = G/2\pi RC$, where C is the value of capacitor 26 and R the value of resistor 20.

For a high quality display, the gain G will be set high so that the output stage has a high unity-gain bandwidth, as in conventional video preamplifiers. For a low quality display however, the gain G will be set low, which will decrease the unity-gain bandwidth. In that case, the connections of the preamplifier output may have parasitic inductances larger than those tolerated with conventional high-speed video preamplifiers, and connection design costs will be reduced.

Figure 3:
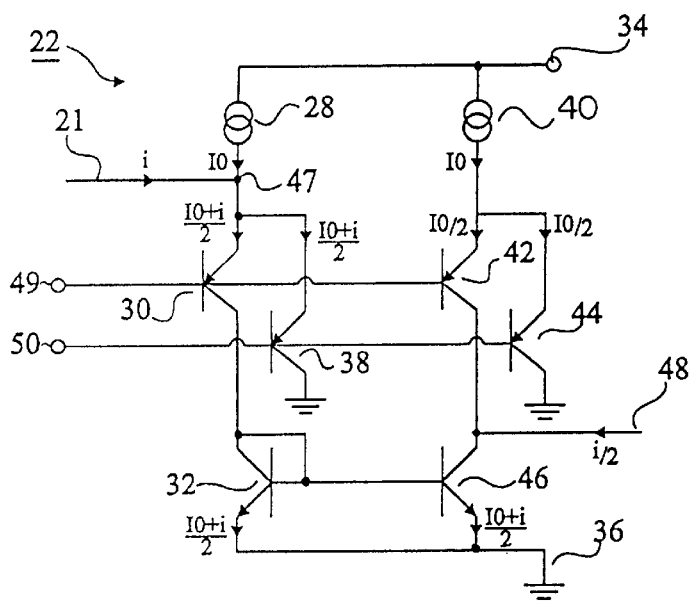
FIG. 3 shows an embodiment of a adjustable gain current amplifier depicted in FIG. 2.

FIG. 3 shows a detailed embodiment of the adjustable gain current amplifier 22 of FIG. 2. A first branch comprises a current source 28 connected in series with a PNP cascode transistor 30 and an NPN transistor between a supply terminal 34 and a reference terminal 36, such as ground. The first branch also comprises a PNP cascode transistor 38 whose emitter is connected to the current source 28, and whose collector is connected to ground. In a second branch, a current source 40, two PNP cascode transistors 42 and 44, and an NPN transistor 46 are connected like current source 28, cascode transistors 30 and 38, and transistor 32, respectively. The node between current source 28 and transistor 30 is connected to an input terminal 47 of the amplifier 22. Input terminal 47 is connected to the input terminal 21. The node between transistors 42 and 46 is the output terminal 48 of the amplifier 22. The bases of transistors 30 and 42 are connected together to a first control terminal 49 of the amplifier 22, and the bases of transistors 38 and 44 are connected together to a second control terminal 50 of the amplifier 22. Transistor 32 is connected as a diode, and its base is connected to the base of transistor 46 in a current mirror configuration. The current sources 28 and 40 produce an identical current I0.

The voltage levels on control terminals 49 and 50 determine the ratio between the currents that flow respectively through transistors 30, 38, and 42, 44. As an example, assuming that the voltages on control terminals 49 and 50 are such that transistors 30, 38 and 40 and 42 have the same conductivity, transistors 30, 38, 40 and 42 are crossed by identical currents I0/2 at rest. If a current i is received on the input terminal 47 of the amplifier 22, transistors 30 and 38 are each crossed by a current equal to (I0+i)/2, while transistors 42 and 44 are still crossed by a current equal to I0/2. Since transistors 32 and 46 form a current mirror, transistor 46 is crossed by a current equal to the current crossing transistor 32, namely (I0+i)/2. Therefore, an output current i/2 flows into the output terminal 48 of the amplifier.

Assume now that the voltage on control terminals 49 and 50 are such that, at rest, a current equal to G.I0 flows in transistors 30 and 42, and a current equal to (1−G)I0 flows in transistors 38 and 44 (where $0 \leq G \leq 1$). If a current i is received on the input terminal 47 of the amplifier 22, a current G(I0+i) flows in transistors 32 and 46, and a current G.i flows into the output terminal 48 of the amplifier.

The output current of amplifier 22 corresponds to the input current i multiplied by a negative factor G determined by the voltages on control terminals 49 and 50. The unity-gain bandwidth $f_c$ of the preamplifier is thus adjusted by changing the voltage of said control terminals.

Figure 4:
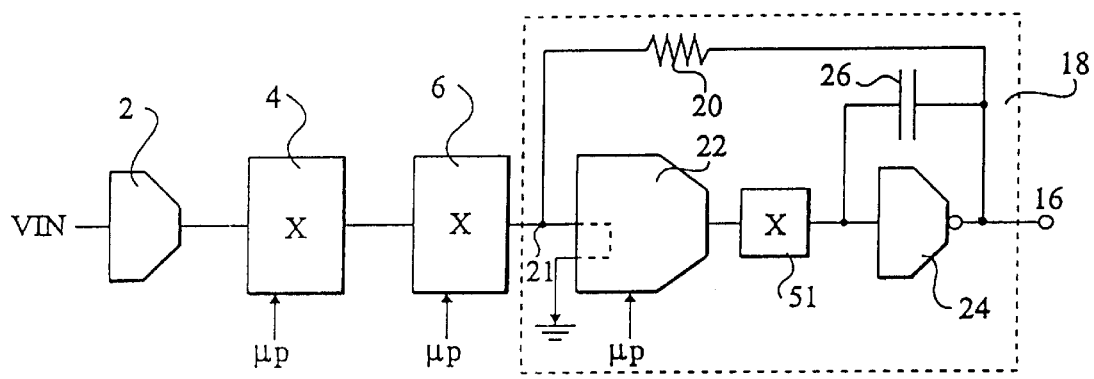
FIG. 4 schematically shows another embodiment of a preamplifier according to the invention.

FIG. 4 shows a second embodiment of an output stage according to the invention. A fixed gain current amplifier 51 has been inserted between the adjustable gain current amplifier 22 and the transconductance circuit 24 of FIG. 2. If amplifier 51 has an amplifying factor K, the unity-gain bandwidth of the preamplifier is $f_c = KG/2\pi RC$. This second embodiment is useful for obtaining current gain factors greater than 1.

Figure 5:
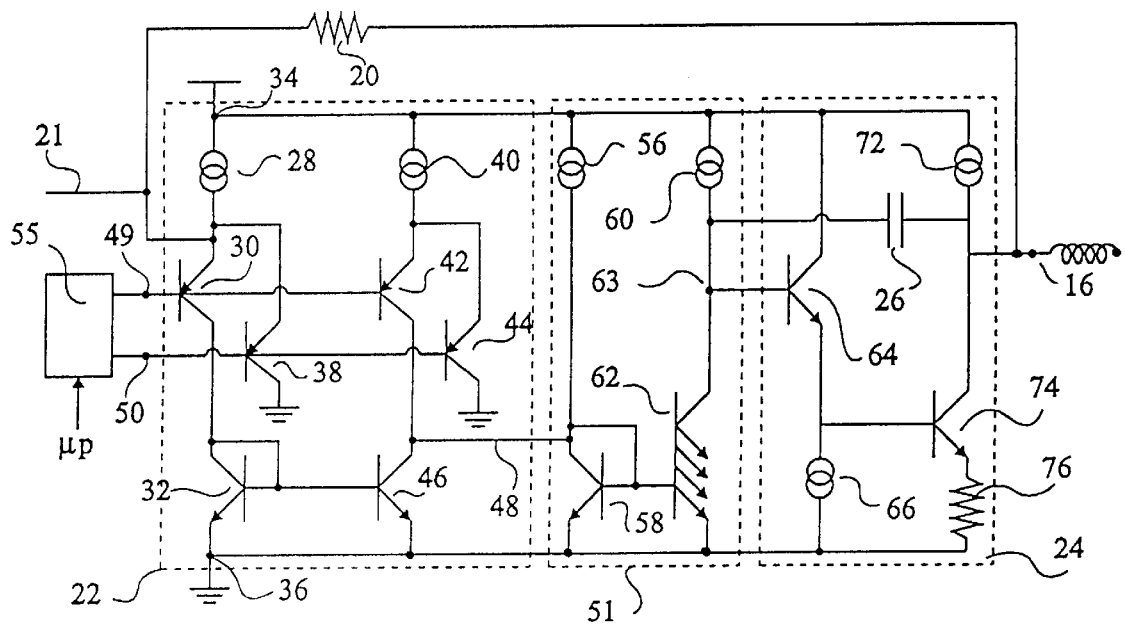
FIG. 5 shows an embodiment of the output stage of the preamplifier of FIG. 4.

FIG. 5 shows a detailed embodiment of the output stage of FIG. 4. The adjustable gain current amplifier 22 is as depicted in FIG. 3. The control terminals 49 and 50 of amplifier 22 are connected to a control circuit 55, controlled by microprocessor 8. The fixed gain current amplifier 51 comprises a current source 56 connected in series with a diode-connected NPN transistor 58, between supply terminals 34 and 36. It also comprises a current source 60 connected in series with an NPN transistor 62 between the supply terminals 34 and 36. Transistor 62 is connected in a current mirror configuration with transistor 58 and it has a larger emitter area than transistor 58. The ratio between the emitter areas of transistors 58 and 62 determines the fixed gain K of amplifier 51.

The node between current source 56 and transistor 58 is connected to the output terminal 48 of amplifier 22. The node between current source 60 and transistor 62 is the output terminal 63 of amplifier 51. It is connected to the input of transconductance circuit 24. Transconductance circuit 24 comprises an NPN transistor 64 connected in series with a current source 66 between supply terminals 34 and 36. Transconductance circuit 24 also comprises a current source 72 connected in series with an NPN transistor 74 and a resistor 76 between supply terminals 34 and 36. The base of transistor 74 is connected between transistor 64 and current source 66. The base of transistor 64 is connected to the output terminal 63 of amplifier 51. The node between current source 72 and transistor 74, connected to terminal 16, is the output terminal of transconductance circuit 24.

Figure 6:
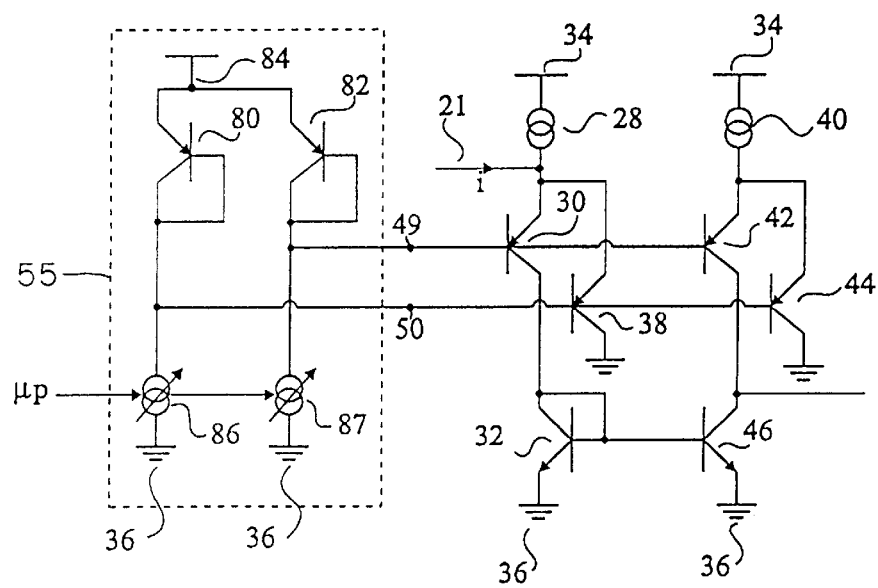
FIG. 6 shows an embodiment of a control circuit of FIG. 5.

FIG. 6 depicts an embodiment of the control circuit 55 used to generate the control voltages provided to the control terminals 49 and 50 of the current amplifier 22. The control circuit 55 comprises two PNP transistors 80 and 82, both connected as diodes, between a supply terminal 84 and a respective variable current source 86, 87 controlled by the microprocessor. Control terminal 49 is connected between transistor 82 and variable current source 87 and control terminal 50 is connected between transistor 80 and variable current source 86.

A current difference in transistors 80 and 82 creates a voltage difference between terminals 49 and 50, which adjusts the current gain of amplifier 22 proportionally to the current difference. One will note that transistors 80 and 82, along with transistors 30 and 38, are connected in a Gilbert multiplier structure, well known in the art.

Various alterations and modifications of the present invention will appear to those skilled in the art. In particular, the structure of fixed gain amplifier 51 and transconductance circuit 24 may be replaced by equivalent structures having the same functions. Such alterations, modifications, and improvements are intended to be part of this disclosure, and are intended to be within the spirit and scope of the invention. Accordingly, the foregoing description is by way of example only and is not intended to be limiting. The invention is limited only as defined in the following claims as the equivalents thereto.

What is claimed is:

1. An amplifier with an adjustable bandwidth, comprising:
   a main input for receiving an input current,
   a main output for providing an output voltage,
   a resistor connected between the main input and output,
   a current amplifier with an adjustable gain, connected for receiving the input current,
   a capacitor connected between an output of the current amplifier and the main output, and
   an inverting transconductance circuit connected between the output of the current amplifier and the main output.

2. The amplifier of claim 1, wherein said current amplifier with an adjustable gain comprises:
   a first current source connected to a first supply terminal;
   a first transistor of a first type having a base connected to a first control input and an emitter connected to an input terminal and to the first current source,
   a second transistor of a second type, diode-connected, having a collector connected to the collector of the first transistor and an emitter connected to a reference terminal,
   a third transistor of the first type, having a base connected to a second control input, an emitter connected to the emitter of the first transistor, and a collector connected to the reference terminal,
   a second current source connected to the first supply terminal,
   a fourth transistor of the first type having a base connected to the first control input and an emitter connected to the second current source,
   a fifth transistor of the second type having a base connected to the base of the second transistor, a collector connected to the collector of the fourth transistor and to an output terminal, and an emitter connected to the reference terminal, and
   a sixth transistor of the first type, having a base connected to said second control input, an emitter connected to the emitter of the fourth transistor and a collector connected to the reference terminal.

3. The amplifier of claim 2, further comprising:

a first control transistor of the first type, diode-connected, having an emitter connected to a second supply terminal and a collector connected to said second control terminal, a first variable current source connected between the second control terminal and the reference terminal, a second control transistor of the first type, diode-connected, having an emitter connected to the second supply terminal and a collector connected to the first control terminal, and, a second variable current source connected between the first control terminal and the reference terminal.

4. The amplifier of claim 3, comprising a fixed gain current amplifier connected between said adjustable gain current amplifier and said inverting transconductance circuit.

5. The amplifier of claim 4, wherein said fixed gain current amplifier comprises:

a third current source connected to the first supply terminal, a seventh transistor of the second type, diode-connected, having a collector connected to an input terminal of said fixed gain current amplifier and to the third current source, and an emitter connected to the reference terminal, a fourth current source connected to the first supply terminal, an eighth transistor of the second type, having a larger emitter area than the seventh transistor, having a base connected to the base of the seventh transistor, a collector connected to an output terminal of said fixed gain current amplifier and to the fourth current source, and an emitter connected to the reference terminal.

6. The amplifier of claim 5, wherein said inverting transconductance circuit comprises:

a ninth transistor of the second type having a base connected to an input terminal of said inverting transconductance circuit, and a collector connected to the first supply terminal, a fifth current source connected between the emitter of the ninth transistor and the reference terminal, a sixth current source connected to the first supply terminal, a tenth transistor of the second type, having a base connected to the emitter of the ninth transistor and a collector connected to the sixth current source and to an output terminal of said inverting transconductance circuit, and a resistor connected between the emitter of the tenth transistor and the reference terminal.

* * * * *